(12) United States Patent
Natarajan et al.

(10) Patent No.: US 11,099,760 B2
(45) Date of Patent: Aug. 24, 2021

(54) BACKGROUND DATA REFRESH USING A SYSTEM TIMESTAMP IN STORAGE DEVICES

(71) Applicant: Intel Corporation, Santa Clara, CA (US)

(72) Inventors: Shankar Natarajan, Folsom, CA (US); Ning Wu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 15/842,799

(22) Filed: Dec. 14, 2017

(65) Prior Publication Data

US 2019/0034114 A1    Jan. 31, 2019

(51) Int. Cl.
| | | |
|---|---|---|
| *G06F 3/06* | (2006.01) | |
| *G11C 16/34* | (2006.01) | |
| *G06F 16/11* | (2019.01) | |
| *G06F 16/174* | (2019.01) | |
| *G11C 16/26* | (2006.01) | |
| *G11C 29/52* | (2006.01) | |
| *G11C 16/04* | (2006.01) | |
| *G11C 16/10* | (2006.01) | |
| *G06F 11/10* | (2006.01) | |

(52) U.S. Cl.
CPC .......... *G06F 3/0647* (2013.01); *G06F 3/0604* (2013.01); *G06F 3/0619* (2013.01); *G06F 3/0679* (2013.01); *G06F 3/0685* (2013.01); *G11C 16/3495* (2013.01)

(58) Field of Classification Search
CPC .... G06F 3/0647; G06F 3/0619; G06F 3/0679; G06F 3/0685; G06F 3/0604; G06F 1/3275; G06F 1/04; G11C 16/3495
See application file for complete search history.

(56) References Cited

U.S. PATENT DOCUMENTS

| | | | | |
|---|---|---|---|---|
| 6,493,772 B1 * | 12/2002 | Hughes | ............... | G06F 11/0727 710/15 |
| 6,513,074 B1 * | 1/2003 | Dimitri | ................. | G06F 3/0613 709/201 |
| 8,898,548 B1 * | 11/2014 | Mullendore | ........ | H03M 13/353 365/185.09 |
| 9,727,473 B2 * | 8/2017 | Dees | ......................... | G06F 1/14 |
| 2011/0302445 A1 * | 12/2011 | Byom | .................... | G06F 12/123 714/6.1 |
| 2013/0007344 A1 * | 1/2013 | Belgal | ................. | G06F 12/0246 711/103 |
| 2014/0059405 A1 * | 2/2014 | Syu | ....................... | G11C 16/349 714/773 |

(Continued)

*Primary Examiner* — Charles Rones
*Assistant Examiner* — Tong B. Vo
(74) *Attorney, Agent, or Firm* — Compass IP Law, PC

(57) ABSTRACT

Techniques for performing background refresh for storage devices using a timestamp from the host are described. In one example, a method involves receiving a timestamp from a host, storing the timestamp in a storage device, and determining a retention time for data stored in one or more blocks of the storage device based on the timestamp relative to a second timestamp indicating when the data was written to the one or more blocks. In response to determining the retention time exceeds a threshold, the storage device moves the data to one or more other blocks of the storage device, which can include interleaving the refresh writes with activity from the host.

16 Claims, 9 Drawing Sheets

(56) References Cited

U.S. PATENT DOCUMENTS

| | | | | |
|---|---|---|---|---|
| 2015/0193302 A1* | 7/2015 | Hyun | .................... | G11C 29/52 |
| | | | | 714/764 |
| 2015/0199268 A1* | 7/2015 | Davis | ................. | G06F 12/0246 |
| | | | | 711/103 |
| 2016/0027523 A1* | 1/2016 | Zhao | .................. | G11C 16/3418 |
| | | | | 365/185.25 |
| 2016/0093397 A1* | 3/2016 | Tabrizi | ............... | G11C 16/3495 |
| | | | | 711/103 |
| 2016/0141042 A1* | 5/2016 | Peterson | ................ | G11C 16/26 |
| | | | | 365/185.11 |
| 2016/0170871 A1* | 6/2016 | Hyun | ........................ | G06F 3/06 |
| | | | | 711/103 |
| 2016/0364175 A1* | 12/2016 | Yang | .................... | G06F 3/0616 |
| 2016/0378380 A1* | 12/2016 | Bish | ..................... | G06F 3/0608 |
| | | | | 711/162 |
| 2017/0062023 A1* | 3/2017 | Datta | .................... | G11C 5/148 |
| 2018/0018111 A1* | 1/2018 | Byun | .................... | G06F 3/0679 |
| 2018/0189175 A1* | 7/2018 | Ji | ......................... | G06F 12/0253 |
| 2019/0179573 A1* | 6/2019 | Hsu | ....................... | G11C 11/005 |

\* cited by examiner

| Die   | 0 |   |   |   | 1 |   |   |   | 2 |   |   |   | 3 |   |   |   |
|-------|---|---|---|---|---|---|---|---|---|---|---|---|---|---|---|---|
| Plane | 0 | 1 | 2 | 3 | 0 | 1 | 2 | 3 | 0 | 1 | 2 | 3 | 0 | 1 | 2 | 3 |
| Band/Super Block | 0 | | | | | | | | | | | | | | | |
| | 1 | | | | | | | | | | | | | | | |
| | 2 | | | | | | | | | | | | | | | |
| | .. | | | | | | | | | | | | | | | |
| | n | | | | | | | | | | | | | | | |

FIG. 3A

| Band/Super block | Write timestamp (Secs) | Current timestamp (Secs) | data retention time (secs) |
|---|---|---|---|
| 0 | 600000 | 9320000 | 8720000 |
| 1 | 800000 | 9320000 | 8520000 |
| 2 | 900000 | 9320000 | 8420000 |
| 3 | 1250000 | 9320000 | 8070000 |
| 4 | 2500000 | 9320000 | 6820000 |
| .. | | | |
| .. | | | |
| n | 4320000 | 9320000 | 5000000 |

FIG. 3B

IDENTIFY - IDENTIFY CONTROLLER DATA STRUCTURE 400A

| Bytes | O/M | Description | | |
|---|---|---|---|---|
| ... | ... | ... | | |
| 3072 | M | Vendor Specific | | |
| | | | Bits | Defintion |
| | | | 0 | If set to '1' then SSD support this feature to accept system clock info |
| 4095:3073 | O | Vendor Specific. | | |

FIG. 4A

SET FEATURES - FEATURE IDENTIFIERS 400B

| Feature Identifier | O/M | Persistent Across Power Cycle and Reset[2] | Uses Memory Buffer for Attributes | Description |
|---|---|---|---|---|
| ... | ... | ... | ... | ... |
| C0h | M | Yes | No | System clock info |
| C1h - FFh | | | | Vendor Specific[1] |

FIG. 4B

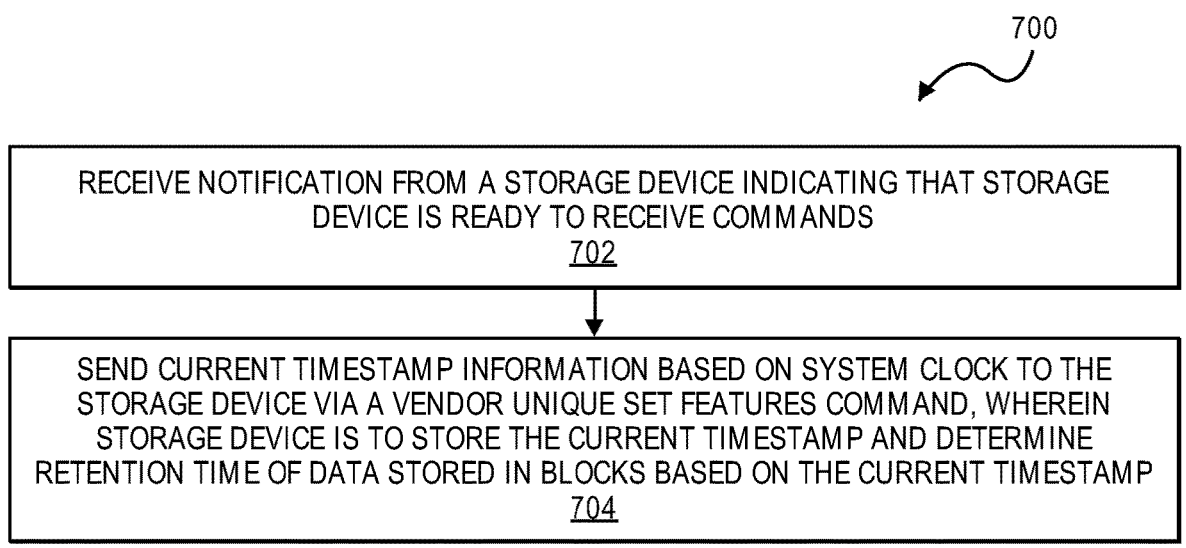

FIG. 7

```
Pseudocode to set background refresh rate 800

802   If (% valid units < 25%) OR (% empty blocks >75%) {
804         Less data to write or more space available to
806         write so the Host activity to background write
808         activity ratio can be 4:1
810   }
812   Else If (% valid units < 50%) OR (% empty blocks >50%) {
814         Host activity to background write activity ratio can
816         be 2:1
818   }
820   Else If (% valid units < 75%) OR (% empty blocks >25%) {
822         Host activity to background write activity ratio can
824         be 1:2
826   }
828   Else {
830         Host activity to background write activity ratio can
832         be 1:4
834   }
```

BACKGROUND DATA REFRESH USING A SYSTEM TIMESTAMP IN STORAGE DEVICES

FIELD

The descriptions are generally related to storage devices such as solid state drives, and more particular descriptions are related to techniques for background data refresh using a system timestamp for storage devices.

BACKGROUND

There is a trend for systems across the mobile, client, and enterprise segments to use solid state drives (SSDs) for data storage. Solid state drives, such as NAND SSDs, include nonvolatile storage. A nonvolatile storage refers to a storage whose state is determinate even if power is interrupted to the device. However, even nonvolatile storage devices have finite data retention capabilities, and may require that data stored in a nonvolatile storage device be refreshed. Failure to refresh data can result in loss of data stored on the nonvolatile storage.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 3A illustrates an example of a superblock for an SSD.

FIG. 3B is a table illustrating an example of information that the SSD can store to enable accurate data refresh.

FIG. 4A illustrates an example of an Identify Controller data structure, which can be used to identify which features are supported by a given storage device, including whether the storage device can accept system clock information.

FIG. 4B is a table showing an example of how the system clock information can be sent from the host to the storage device via a Set Feature command.

FIG. 7 is a flow chart illustrating an example of a method performed by a host to provide a system timestamp to enable background refresh.

FIG. 8 is an example of pseudocode for setting the background refresh rate.

Figure 1:
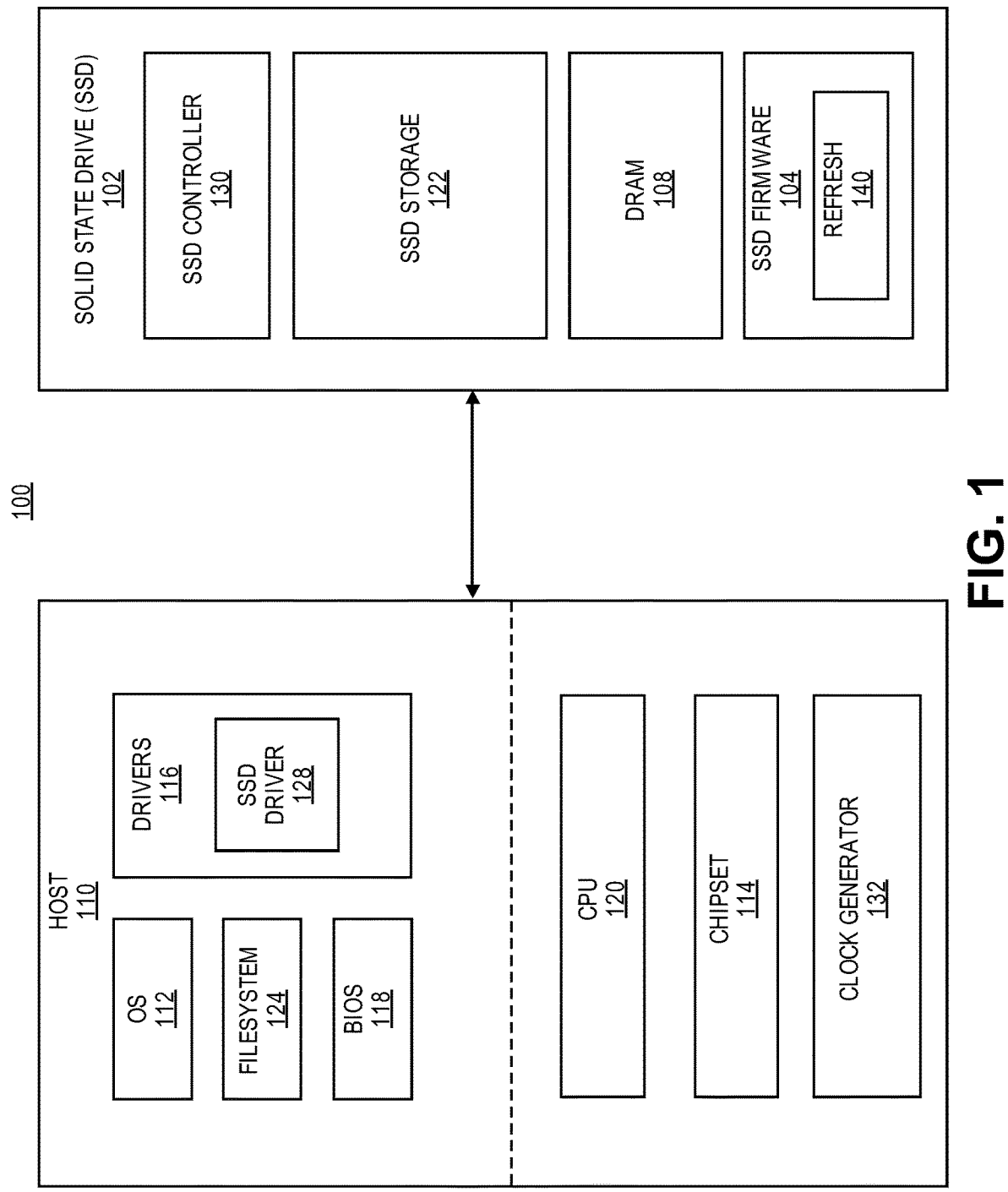
FIG. 1 illustrates a block diagram of a system with an SSD in which background data refresh can be implemented, in accordance with one example.

Descriptions of certain details and implementations follow, including a description of the figures, which may depict some or all of the embodiments described below, as well as discussing other potential embodiments or implementations of the inventive concepts presented herein.

DETAILED DESCRIPTION

Described herein are techniques for background data refresh for nonvolatile storage devices, such as solid state drives (SSDs). Background data refresh involves refreshing "cold data" stored in a storage device to avoid retention related errors or failures. Cold data is data that is stored on the storage device and which is not accessed frequently. Cold data can be stored on the storage device without being accessed for a period of time that approaches or exceeds the maximum retention capability of a storage device. Refreshing data involves writing the data to another location (or re-writing the data to the same location), which can prevent data loss.

Enterprise solid state drives (SSDs), such as SSDs used in servers, implement refresh techniques that rely on an internal time clock. It is common for enterprise SSDs to be always powered on and to maintain a time clock of when data was written to the SSD blocks. However, SSDs used in mobile or other consumer devices are not continuously powered on, and frequently enter low power states to reduce power consumption and preserve battery life. When powered down or in the lowest power modes, most of the components of the storage device are powered off, including components for maintaining a time clock. Therefore, existing techniques for refreshing data stored in SSDs are ineffective for mobile and other consumer SSDs.

A technique for background data refresh which uses the system clock instead of relying on an internal clock can enable refresh of cold data stored on the storage devices even if the storage has been powered off or in a low power state. In one example, the storage device maintains timestamp information for each superblock (or each block, page, or other granularity) that is storing data to indicate when the data was written to the superblock. When the storage device is powered off or goes into a low power state, the storage device saves the timestamp information to nonvolatile media (NVM). After the storage device powers up or exits a low power state, the storage device loads the timestamp information from the nonvolatile storage, and also receives a timestamp from a host indicating the current time. In contrast to existing techniques, the storage device can use the current timestamp received from the host to accurately determine the retention time for data at each of the superblocks storing data, even though the device was powered off or in a low power state for a period of time. If the retention time exceeds a threshold, the storage device can refresh the data. In one example, the storage device refreshes the data by putting those superblocks in a queue, and interleaving writes from the queue with host traffic. Thus, refresh techniques that use the system clock from the host can enable accurate determination of retention times in mobile and other consumer devices and reduce the loss of data.

FIG. 1 illustrates a block diagram of a system with an SSD in which background data refresh can be implemented, in accordance with one example. System 100 includes solid state drive (SSD) 102 coupled with host 110.

The host 110 represents a host hardware platform that connects to the SSD 102. The host 110 includes a CPU (central processing unit) 120 or other processor as a host processor. The CPU 120 represents any host processor that generates requests to access data stored on the SSD 102, either to read the data or to write data to storage 122. Such a processor can include a single or multicore processor, a primary processor for a computing device, a graphics processor, a peripheral processor, or a supplemental or auxiliary processor, or a combination. The host 110 includes chipset 114, which represents hardware components that can control or manage the flow of data between the CPU 120 and other components of the system 100, including the SSD 102. For example, the chipset 114 can include interconnect circuits and logic to enable access to the SSD 102. In one example, the chipset 114 includes a storage controller, which is a host-side controller that is separate from a controller 130 within the SSD 102. Although FIG. 1 illustrates a chipset in the host, which includes logic to control access to the SSD, in other examples, the host 110 may not include a chipset, or if it does include a chipset, the storage controller can be independent from the chipset. In one example, the chipset, the storage controller, or both, are integrated with the CPU 120. The host 110 also includes a clock generator 132 to generate a system clock. In one example, the clock generator 132 includes a circuit, such as a resonant circuit and an amplifier, to produce a timing signal for use in synchronizing operation of the platform 100.

The host also includes firmware and software executing on the hardware, such as an operating system 112, a filesystem 124, a basic input/output system (BIOS) 118, drivers 116, and other firmware and software. When the system is powered on, the BIOS 118 is typically responsible for initializing the hardware and loading the operating system 112. The operating system 112 is typically responsible for the management, coordination, and scheduling of activities on the system 100 as well as for the sharing of resources of the system. The filesystem 124 interacts with software, firmware, or both, to access the SSD 102. For example, the host 110 can include an SSD driver via which the operating system 112 and the filesystem 124 can access the SSD. One example of an SSD driver is the Intel® Rapid Storage Technology (RST) driver. Although the system 100 is illustrated as a computer system with a host operating system and an SSD to store data, the system 100 can alternatively include SPI (serial peripheral interface) storage or storage connected to a SPI bus, LSM-based (log-structured-merge-based) key-value solutions, three-dimensional crosspoint memory based solutions, or other storage systems.

The SSD 102 represents a solid state drive that includes nonvolatile storage 122 (which can also be referred to as nonvolatile media (NVM)) for storing data. The SSD 102 can be a flash based drive connected to a processor using a PCI Express (PCIe), serial advanced technology attachment (ATA), a parallel ATA, and/or a universal serial bus (USB) interface. The storage 122 can include one or more of NAND, NOR flash, phase change memory (PCM), phase change memory with switch (PCMS), resistive memory, or other nonvolatile storage media. Data may be stored in single level cell (SLC), triple level cell (TLC), Quad level cell (QLC) and/or multi-level cell (MLC) format. The TLC, QLC, and/or MLC cells or blocks are typically used to store user data. The SLC cells or blocks, which generally have faster access speeds at the expense of a reduction in storage density, typically do not store user data and are typically not accessible by the host. The SLC cells or blocks can be used by the SSD to store "system data" related to the operation of the SSD.

In addition to the nonvolatile storage 122, the SSD 102 can also include DRAM 108 (or other volatile memory). The DRAM 108 includes volatile memory that can store data while the solid state drive 102 is powered on (e.g., operational). The DRAM 108 can include, for example, LPDDR3 (low power dual data rate version 3, original release by JEDEC (Joint Electronic Device Engineering Council) JESD209-3B, August 2013 by JEDEC), LPDDR4 (LOW POWER DOUBLE DATA RATE (LPDDR) version 4, JESD209-4, originally published by JEDEC in August 2014, or other types of DRAMS. The DRAM can comply with a standard promulgated by the Joint Electron Device Engineering Council (JEDEC), such as JESD79F for DDR Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Other volatile memory may be used. Some SSDs do not include a DRAM (e.g., "DRAM-less" SSDs). In one such example, the SSD can include an SSD controller memory (not shown), which is typically SRAM. The DRAM 108 can be used to store data related to the operation of the SSD 102, such as a logical-to-physical indirection table or other such information.

The SSD 102 also includes a controller 130 to control access to the storage 122. In one example, the controller 130 includes an interface to the storage 122, and includes an interface to the host 110. The controller 130 hardware logic to control the writing to storage 122 and reading from storage 122. The controller 130 may be an application specific integrated circuit controller (ASIC) device connected to an interface such as a serial ATA or an integrated drive electronics controller. In another example, the controller 130 includes a processor or other processing circuitry (not shown). In one example, the controller 130 may be included in a System-on-a-Chip (SoC) onto a single integrated circuit chip.

The SSD 102 also includes firmware 104. The firmware 104 can perform a variety of functions such as translation, garbage collection, wear levelling, and other functions for the operation and optimization of SSD 102. In one example, the firmware 104 can include the flash translation layer (FTL), which includes logic to provide indirection to identify the physical addresses space for logical addresses such as logical block addresses (LBAs) of requests received from filesystem 124.

In the illustrated example, the firmware 104 includes refresh logic 140 to perform background refresh to ensure data stored in storage 122 is not lost or corrupted. Existing techniques for refreshing data in SSDs typically rely on SSD "power on hours" or a clock internal to the SSD (such as an ASIC time clock of the controller 130) to determine which data to refresh. Such existing techniques are ineffective for determining when to refresh data for some systems, such as mobile devices, in which the SSD is frequently powered down or put into a low power state. For example, the SSD "power on hours" is a count stored on the SSD (e.g., in a register on the SSD, or in another location on the SSD, such as in blocks of the SSD that are not accessible by the host) indicating how many hours the SSD has been in a power-on state. Refresh techniques relying on the SSD "power on hours" do not take into account the time that data is retained in storage 122, but the device is either powered off or in a low power state. Therefore, such techniques may result in insufficiently frequent refresh of data and data loss. Similarly, refresh techniques that rely on a time clock located on the SSD 102 also may not be sufficiently accurate, because the circuitry that includes the clock is powered down when the SSD 102 is powered down or in the lowest power states.

Figure 2:
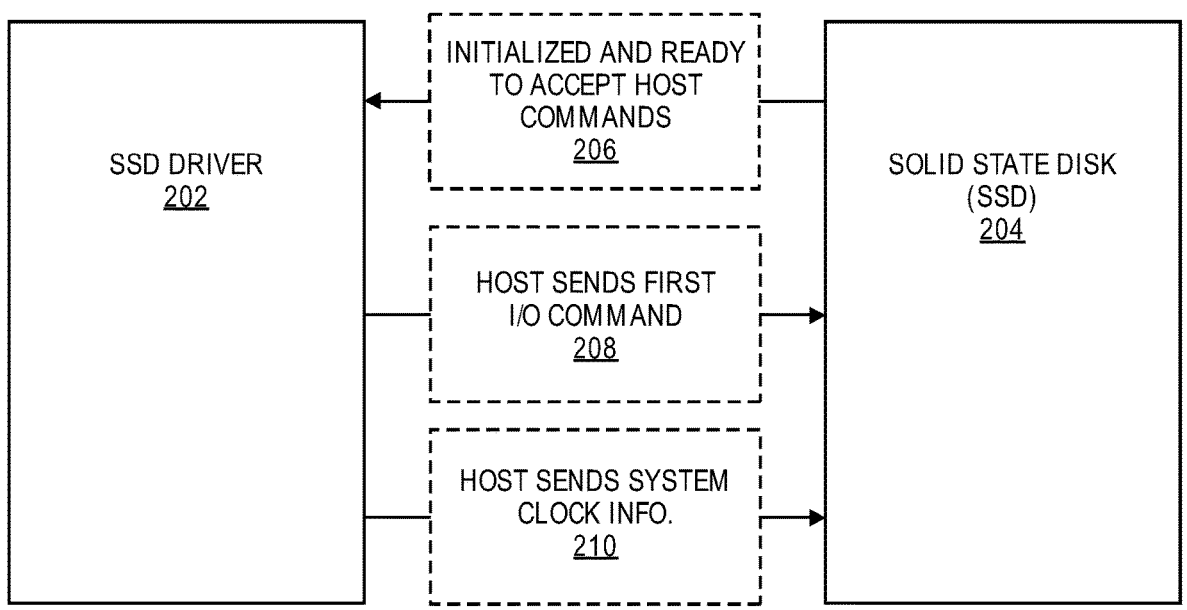
FIG. 2 is a block diagram illustrating an example of communication of system clock information from a host to an SSD.

However, unlike existing techniques, the SSD firmware 104 can accurately track retention time of data stored in SSD storage 122 by maintaining information about when data was written to each superblock and based on a current timestamp from the host. By accurately tracking retention time, the SSD firmware 104 can more accurately determine when data needs to be refreshed to avoid data loss. For example, FIG. 2 is a block diagram illustrating an example of communication of system clock information from a host to an SSD. FIG. 2 shows an SSD driver 202 coupled with an SSD 204. The SSD driver can be the same or similar to the SSD driver 128 of the host 110 illustrated in FIG. 1, and the SSD 204 can be the same as or similar to the SSD 102 of FIG. 1. Blocks 206, 208, and 210 represent operations in a method to communicate a timestamp from the host to the SSD. In the illustrated example, the operations 206, 208, and 210 occur after power-on or exit from a low power state. The low power state can be a "sleep state." In one example, the low power state is a state in which the majority of the components (including the SSD controller, DRAM, NVM and other discrete components on the board) of the SSD 204 are turned off (e.g., PS4 in the Non-volatile Memory Express (NVMe) protocol and L1 or L1.2 in PCI Express (PCIe) protocol). The NVMe protocol can refer to the protocol described in the NVMe Specification version 1.3, published May 1, 2017 or another version of the NVMe Specification. The PCIe protocol can refer to the protocol described in the PCI Express® Base Specification version 3.0, published Nov. 10, 2010 or another version of the PCI Express® Base Specification.

After the SSD 204 is powered on or after the SSD 204 exits a low power state, the SSD 204 notifies the SSD driver 202 that the SSD is initialized and ready to accept host commands, at block 206. In one example, upon (e.g., immediately after) the first I/O command (at operation 208), the SSD driver 202 sends system clock information (e.g., in the form of a timestamp) to the SSD 204, at operation 210. In another example, the SSD driver 202 can send the system clock information prior to the first I/O command to the SSD. In one example, a command via which the system clock information is sent is triggered by the storage driver upon completion of a PCIe/NVMe protocol handshake for device (SSD) ready. Once the SSD 204 receives the system clock information from the host, the SSD can use the system clock information from the host to accurately determine retention times and refresh data that is at risk of being lost or corrupted due to exceeding a threshold. For example, the SSD can store timestamps indicating when data was written to a given superblock. Based on the timestamps indicating when data was written to a given superblock relative to the current timestamp from the host, the SSD can also determine and store retention times for the superblocks. In one example, the SSD can store the timestamp information and retention times in volatile memory of the SSD while the SSD is operating (e.g., in a state in which the DRAM of the SSD is powered on and operational).

As mentioned briefly above, the SSD can track such information on a superblock granularity (e.g., for each superblock that has been written to). A superblock (also known as a band) is a block across all planes across all dies. FIG. 3A illustrates an example of a superblock for a quad plane, 4 NAND die SSD. In the example illustrated in FIG. 3A, the SSD has four different dies (e.g., dies 0, 1, 2, and 3), each die has four planes (e.g., 0, 1, 2, and 3), and each plane has blocks (e.g., blocks 0-n). Thus, in the illustrated example, superblock 0 includes block 0 in each plane of each die. Accordingly, in one example, the SSD can track timestamps and retention time for each superblock (e.g., superblocks 0-n). FIG. 3B is a table illustrating information that the SSD can store to enable accurate data refresh. The information illustrated in the table of FIG. 3B (e.g., timestamps and retention times) can be stored in volatile memory while the SSD is operating and in nonvolatile storage when the SSD is powered off or in a low power more (e.g., a low power mode in which the DRAM is not operational). For example, referring to FIG. 1, the DRAM 108 of the SSD 102 can store timestamp and retention time information when the SSD is operating. In a DRAM-less SSD, the timestamp and retention time information can be stored in another location, such as SSD controller memory. Then, prior to entering a low power mode or being powered off, the SSD 102 can store the timestamp and retention time information to SSD storage 122. In one such example, the SSD 102 stores the timestamp and retention time information to SLC blocks (e.g., reserved or "system" SLC blocks, which are typically not directly accessible by the host) of the SSD storage 122. Referring again to FIG. 3B, note that although the timestamps and retention time are in seconds, other granularities of time can be used (e.g., minutes, hours, days, or other units of time). Similarly, although the table in FIG. 3B illustrates an example in which timestamps for each superblock are stored, other granularities can be used. For example, the SSD can store timestamp information for each block, or only for blocks or superblocks that have been written to, or for other granularities.

In the illustrated example, each entry of the table includes a write timestamp indicating the time when the superblock was written to. The SSD also stores a current timestamp based on a time clock on the host. In the example described in reference to FIG. 2, the host sends the current timestamp to the SSD in response to receiving notification from the SSD that the SSD is initialized and ready to accept commands (e.g., after power-up or exit from a low power mode). Note that although the table of FIG. 3B shows the current timestamp multiple times (for each superblock), the SSD can store the current timestamp only once, rather than for each superblock. In one example, the SSD also stores the data retention time for each superblock. In one example, the data retention time is computed by subtracting the write timestamp from the current timestamp.

Referring again to the current timestamp, in one example, a protocol is established for communication of the current timestamp from the host to the SSD. By having a protocol that both the SSD firmware and the SSD driver comply with, the SSD driver can provide a timestamp that is in line with what the SSD is expecting, and the SSD can correctly interpret the timestamp received from the host. FIGS. 4A and 4B illustrate an example of some features of a protocol for communicating the timestamp from the host to the SSD.

FIG. 4A illustrates an example of an Identify Controller data structure, which can be used to identify which features are supported by a given storage device, including whether the storage device can accept system clock information. The data structure 400A can be used in a protocol such as Non-volatile Memory Express (NVMe) or other storage protocol. NVMe defines an Identify command, which the host sends to the storage device to identify which capabilities and settings apply to a storage controller (e.g., the SSD controller 130 of FIG. 1). In response to receiving the Identify command, the storage device will return a data structure (e.g., the Identify Controller data structure 400A) that includes information regarding one or more features. In the data structure 400A, a range of bytes is reserved for vendor specific features. In the illustrated example, bytes 4095:3072 are reserved for vendor specific features, including one byte for identifying whether the storage device supports the feature to accept system clock information. By setting bit 0 of byte 3072 to a logic 1, the storage device indicates that the feature is supported, and by setting the bit to a logic 0, the storage device indicates that the feature is not supported. The opposite convention can also be used (e.g., a logic 0 can indicate that a feature is supported). Although the byte is shown as mandatory (as indicated by the 'M' in the 'O/M' column), the byte can be optional in other examples.

If the storage device does support the feature to accept system clock information (e.g., as indicated by byte 3072 in the data structure 400A), the host can communicate the system clock information to the storage device at some predetermined times, such as after power-up or after exit from a low power state. For example, the host can communicate the system clock information via a vendor unique Set Feature command.

FIG. 4B is a table showing an example of how the system clock information can be sent from the host to the storage device via a Set Feature command. For example, the table 400B illustrates Feature Identifiers for the NVMe Set Features command. Prior to the host sending the Set Features command to the storage device, the host (e.g., via a storage driver such as the SSD driver 128) sets the Feature Identifier C0h to reflect the current time as indicated by the system clock. The current timestamp can be defined as the number of seconds (or milliseconds (ms), minutes, hours, or other granularity of time) that as elapsed since a predetermined date and time. Other timestamp formats are possible as long as the format is defined by a protocol and followed by both the host and storage device. In the illustrated example, the System clock information feature is in the vendor specific features (e.g., vendor specific feature identifiers include bytes C0h-FFh in the illustrated example). However, other feature identifiers or other commands can be used. The host then sends the command including the feature identifiers to the storage device. The storage device can store the current timestamp for determination of data retention time, as described above and in more detail below.

Figure 5:
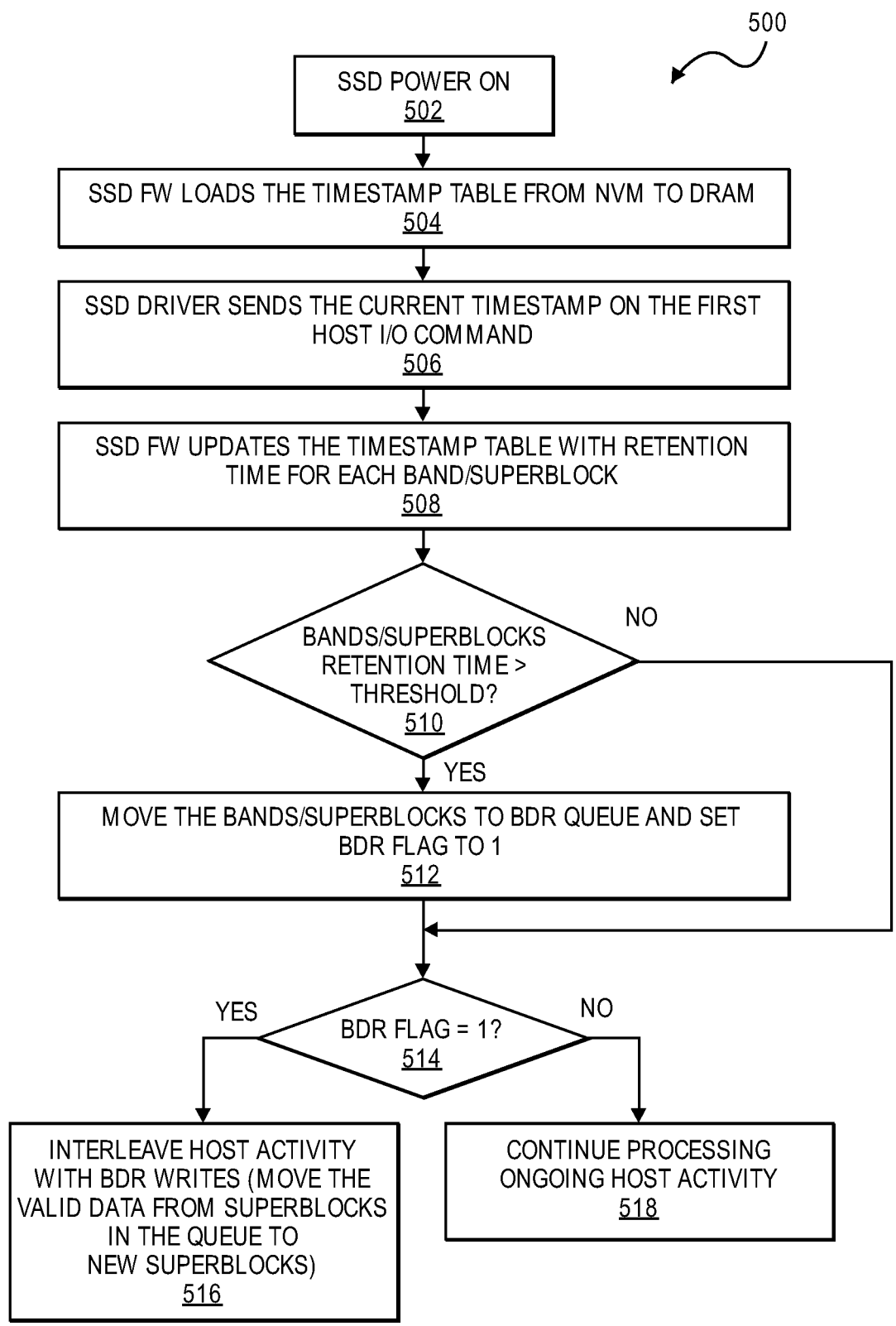
FIG. 5 is a flow chart illustrating an example of a method for performing background refresh using a system timestamp.
Figure 6:
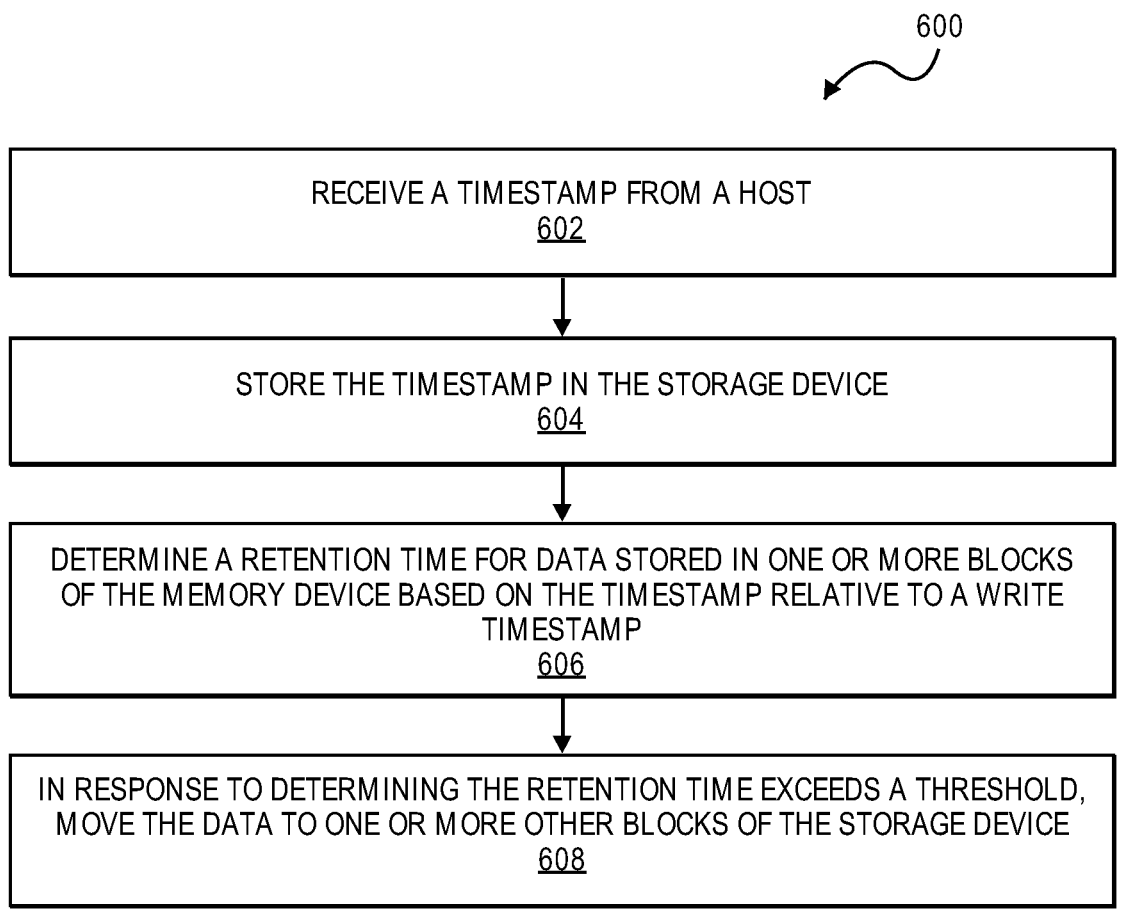
FIG. 6 is a flow chart illustrating an example of a method performed by a storage device to perform background refresh using a system timestamp.

FIGS. 5-7 are flow charts illustrating examples of methods for performing background refresh using a system timestamp. FIG. 5 is a flow chart from a system perspective, including operations performed by both the host and the storage device. FIG. 6 is a flow chart from the storage device perspective. FIG. 7 is a flow chart from a host perspective. As mentioned above, existing techniques for refreshing data in nonvolatile media can be ineffective for storage devices that are frequently powered-off or put into a low power state. In the methods of FIG. 5-7, a timestamp from the host is used to more accurately determine data retention time, and therefore can enable improved data refresh.

Referring to FIG. 5, the method 500 begins with an SSD powering on, at operation 502. Alternatively, the method 500 could begin with the SSD exiting a low power state (e.g., waking up or entering a higher power state). The SSD can be the same or similar to the SSD 102 of FIG. 1. The SSD firmware then loads a timestamp table from nonvolatile storage to DRAM at operation 504. For example, with reference to FIG. 1, the SSD firmware 104 can load the timestamp table from SSD storage 122 to the DRAM 108. In one example in which the SSD does not include DRAM, the SSD firmware can load the timestamp table from SSD storage 122 to SSD controller memory. Loading the timestamp table can include loading the write timestamps for one or more superblocks (or other granularity) from SSD storage 122. The SSD driver on the host side then sends the current timestamp on the first host I/O command, at operation 506. For example, the SSD driver 128 can send a timestamp via a vendor unique Set Features command, such as illustrated in FIG. 4B. In one such example, the SSD driver sends the timestamp via a vendor unique Set Features command immediately after the first host I/O command (e.g., after the first write, read, or other I/O command). In one example, the host sends the timestamp information immediately after the first I/O command (e.g., with no intervening commands between the first I/O command and the vendor unique Set Features command) to enable deterministic behavior. In another example, the SSD driver can send the timestamp before the first I/O command, or if the timestamp is sent after the first write command, there can be one or more intervening commands between the first I/O and the vendor unique Set Features command. Other commands other than a vendor unique Set Features command may be used.

The SSD firmware then updates the timestamp table with retention time for each superblock in the table, at operation 508. For example, the SSD firmware 104 can compute the data retention time for each superblock by subtracting the write timestamp from the current timestamp. In one example, the SSD firmware stores the computed data retention time for each superblock.

After determining the retention times for one or more superblocks, the SSD firmware can then check to see if the retention time exceeds a threshold, at operation 510. The threshold can be a predetermined number that is dependent on the characteristics of the SSD. The threshold can be static (e.g., the same threshold is used throughout the lifetime of the SSD) or dynamic (e.g., the threshold can be updated as the SSD is used over time). If the retention time has exceeded the threshold, 510 YES branch, then the SSD firmware moves the superblocks to a background data refresh (BDR) queue and sets a flag (e.g., a BDR flag) for the superblock to indicate the data should be moved, at operation 512. The queue can be implemented in firmware, hardware, or a combination. In one example, moving a superblock to the BDR queue can involve setting the BDR flag for the superblock. The flag can include one bit or multiple bits, and setting the flag to indicate the data at a given superblock is to be moved can involve setting the flag to a logic 1 or a logic 0, or another value to indicate the data at the superblock should be moved. In another example, moving a superblock to the BDR queue can also or alternatively involve storing some information to identify the superblock to a queue data structure. If the BDR flag is set (e.g., set to a value to indicate the data is to be moved), 514 YES branch, the SSD firmware interleaves host activity with BDR writes to move the valid data from superblocks in the BDR queue to new superblocks, at 516. One or more of the operations can be performed by a garbage collection routine, which is typically a routine of the SSD firmware (e.g., a part of the firmware 104 of FIG. 1). For example, the interleaving of the host activity with BDR writes and performance of the BDR writes can be performed by a garbage collection routine.

If the retention time of a given superblock does not exceed the threshold, 510 NO branch, then the superblock is not placed in the queue, the BDR flag is not set (514 NO branch), and the SSD continues processing ongoing host activity, at operation 518. Thus, in one example, at every power cycle, the SSD firmware scans through the data retention time for each superblock. If the retention time exceeds the retention time threshold, the superblocks are put in a BDR queue to be picked up by garbage collection routine to move the data and the BDR flag is set by firmware. The firmware checks for the BDR flag, and if set, the firmware triggers a garbage collection routine and the blocks in the BDR queue can be prioritized for garbage collection. When the SSD is going to a low power state or will be powered off, the SSD firmware stores the timestamp information to the SSD storage 122, so that the information can be retrieved when the SSD wakes up or powers up.

FIG. 6 is also a flowchart of a method of performing background refresh using a timestamp from the host, in accordance with one example. The method 600 of FIG. 6 is performed by a storage device (e.g., performed by SSD firmware, such as the firmware 104 of FIG. 1). The method 600 begins with receiving a timestamp from a host (e.g., the host 110 of FIG. 1), at operation 602. For example, the firmware can receive a command, such as a vendor unique Set Features command that includes a timestamp from the host. The SSD firmware then stores the timestamp in the storage device, at operation 604. For example, the firmware can store the timestamp in DRAM of the SSD (e.g., the DRAM 108 of the SSD 102 of FIG. 1). After receiving the timestamp from the host, the firmware determines a retention time for data stored in one or more blocks of the storage device based on the timestamp relative to a write timestamp, at operation 606. The write timestamp indicates when the data was written to the one or more blocks (e.g., blocks, superblocks, or other granularity of storage space). The firmware can also store the retention times of the one or more blocks to DRAM. If the retention time exceeds a threshold, the firmware moves the data to one or more other blocks of the storage device, at operation 608. For example, the firmware (e.g., the refresh logic 140 of FIG. 1) can interleave refresh writes with host activity to refresh data in the background of host activity.

FIG. 7 is a flowchart of a method of transmitting a current timestamp based on a system clock to a storage device, in accordance with one example. The method 700 of FIG. 7 can be performed by a host (e.g., the SSD driver 128 of host 110 of FIG. 1). The method 700 begins with the host receiving notification from a storage device (e.g., SSD 102 of FIG. 1) indicating that the storage device is ready to receive commands, at operation 702. The host then sends current timestamp information based on a system clock of the host to the storage device via a vendor unique Set Features command, at operation 704. For example, the host can send the timestamp via a command as specified in FIG. 4B. However, other commands can also be used to provide the timestamp to the storage device. The storage device stores the current timestamp and can determine retention time of data stored in blocks of the storage device based on the current timestamp.

Thus, the methods of FIGS. 5-7 illustrate methods for transmitting a current timestamp from a host to a storage device, determining retention times of data stored on the storage device using the current timestamp, and performing background refresh based on the retention times. As mentioned briefly above, refreshing data can be done in the background in the sense that refresh activity can be interleaved with host activity. However, the volume of writes that need to be performed due to refresh as well as host activity can vary significantly. Therefore, in one example, the storage device (e.g., SSD firmware) can dynamically determine the ratio of refresh writes to host activity. For example, the ratio for interleaving refresh writes and host activity can be based on one or more of: retention times of blocks in the queue, the number of commands from the host, the number of blocks to be refreshed, and the available space for performing refresh (e.g., the number of empty blocks).

FIG. 8 is an example of pseudocode 800 for setting the background refresh rate. In the pseudocode 800, the rate of background writes for refresh will be varied based on the following variables: the percentage of valid units to move from the source block, and the percentage of empty blocks available for the destination. The percentage of valid units to move from the source block is given by: the valid units in the block divided by the total units in the block (where the total units includes both the valid and invalid blocks). The percentage of empty blocks is given by the current empty blocks divided by the total allocated empty blocks. If the percentage of valid units is less than 25% or if the percentage of empty blocks is greater than 75% (at line 802) then it is an indication that there is less data to write or more space available to write, so the host activity to background write activity ratio can be set to a relatively high ratio, such as 4:1, at lines 804-810. If the % of valid units is less than 50% or the percentage of empty blocks is greater than 50% (at line 812), then the firmware can set the ratio of host activity to background write activity to 2:1, at lines 814-818. If the percentage of valid units is less than 75% or if the percentage of empty blocks is greater than 25% (at line 820), then the ratio of host activity to background write activity can be set to 1:2, at lines 822-826. Else (at line 828), the ratio of host activity to background write activity can be set to 1:4, at lines 830-834. These ratios are examples and other ratios can be used to perform background refresh to achieve performance targets and prevent data corruption. For example, a ratio that is higher than 4:1 (e.g., 8:1, 16:1, 32:1, or a higher ratio) can be used, or a ratio that is lower than 1:4 (e.g., 1:8, 1:16, 1:32, or a lower ratio) can be used.

Figure 9:
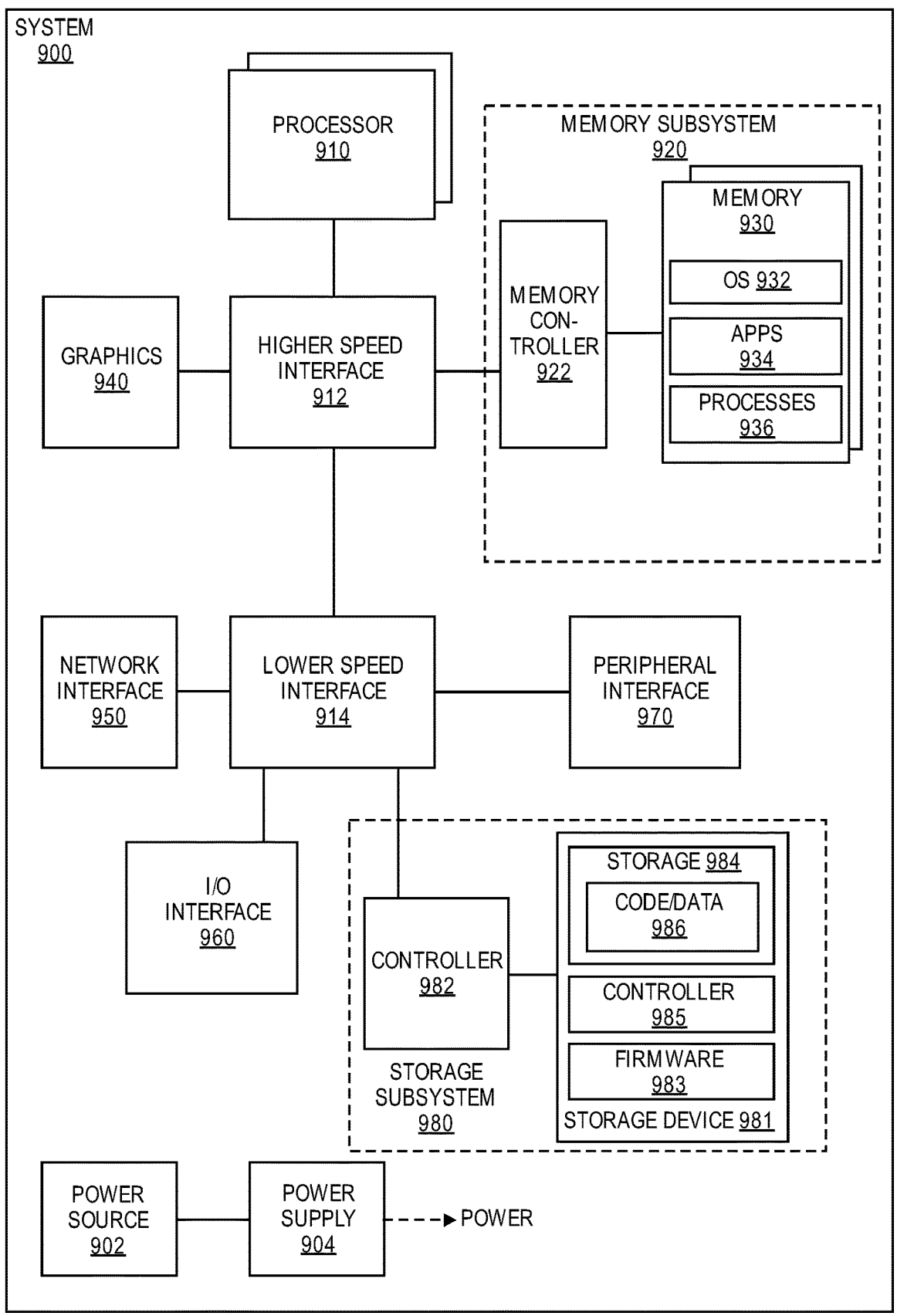
FIG. 9 is a block diagram of an example of a computing device with an SSD in which background data refresh can be implemented, in accordance with one example.

FIG. 9 is a block diagram of an example of a computing system that includes a nonvolatile storage device that implements background data refresh techniques. System 900 represents a computing device in accordance with any example herein, and can be a laptop computer, a desktop computer, a tablet computer, a server, a gaming or entertainment control system, a smartphone, or other electronic device.

System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display that provides an output to a user. In one example, the display can include a touchscreen display.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, PCI Express (PCIe), a HyperTransport or industry standard architecture (ISA) bus, a small computer system interface (SCSI) bus, a universal serial bus (USB), or an Institute of Electrical and Electronics Engineers (IEEE) standard 994 bus.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts. The system 900 also includes a power source 902, which provides power to the components of system 900. More specifically, power source 902 typically interfaces to one or multiple power supplies 904 in system 902 to provide power to the components of system 900.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 981, which includes nonvolatile storage 984. Nonvolatile storage 984 can be any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes a host-side controller 982 to interface with the storage device 981 and a storage-side controller 985 to interface with the host. In one example controller 982 is a physical part of interface 914 or processor 910, or can include circuits or logic in both processor 910 and interface 914. The storage device 981 also includes firmware 983, which can perform a variety of functions, such as is described above with respect to the firmware 104 of FIG. 1. In one example, the storage device 981 can be the same or similar to the SSD 102 of FIG. 1. In one such example, the storage device 981 performs improved background refresh techniques using a timestamp from the host, as described herein.

Figure 10:
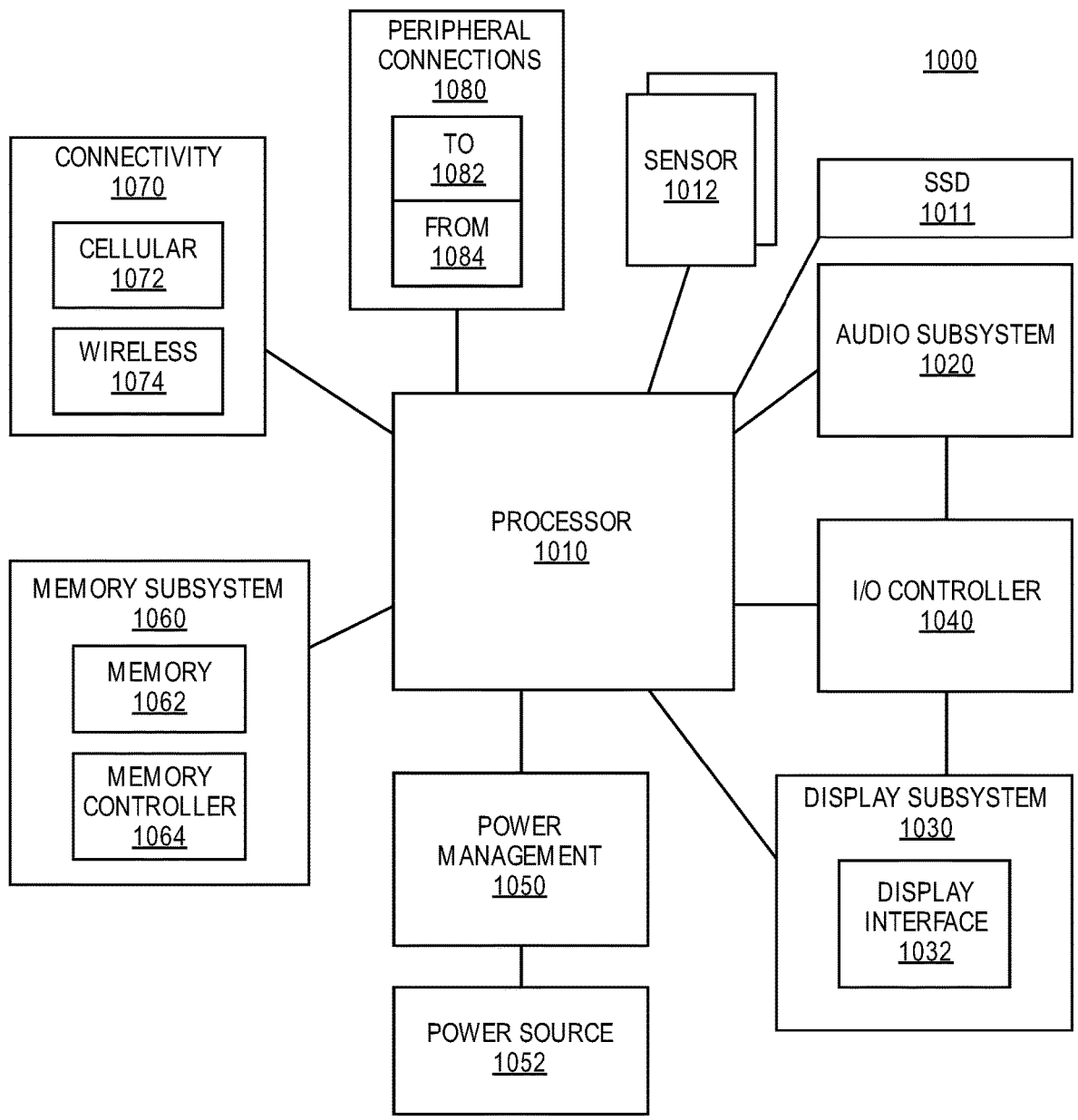
FIG. 10 is a block diagram of an example of a mobile device with an SSD in which background data refresh can be implemented, in accordance with one example.

FIG. 10 is a block diagram of an example of a mobile device that includes a nonvolatile storage device that implements background data refresh techniques. Device 1000 represents a mobile computing device, such as a computing tablet, a mobile phone or smartphone, a wireless-enabled e-reader, or other mobile device. It will be understood that certain of the components are shown generally, and not all components of such a device are shown in device 1000.

Device 1000 includes processor 1010, which performs the primary processing operations of device 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting device 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. In one example, one or more sensors 1012 couples to processor 1010 via a frontend circuit integrated with processor 1010. In one example, one or more sensors 1012 couples to processor 1010 via another component of system 1000.

In one example, device 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1000, or connected to device 1000. In one example, a user interacts with device 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

In one example, device 1000 includes power management 1050 that manages battery power usage, charging of the battery, and features related to power saving operation. Power management 1050 manages power from power source 1052, which provides power to the components of system 1000.

Memory subsystem 1060 includes memory device(s) 1062 for storing information in device 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable device 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading, uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The device 1000 also includes a solid state drive (SSD) 1011, which provides non-volatile storage for the device 1000. The SSD 1011 can be the same as, or similar to, the SSD 102 of FIG. 1. In one such example, the SSD 1011 performs improved background refresh techniques using a timestamp from the host, such as described herein.

Examples of methods, apparatuses, and systems for implementing background refresh techniques follow. In one example, a method involves receiving a timestamp from a host, storing the timestamp in a storage device, determining a retention time for data stored in one or more blocks of the storage device based on the timestamp relative to a second timestamp indicating when the data was written to the one or more blocks, and in response to determining the retention time exceeds a threshold, moving the data to one or more other blocks of the storage device. In one example, receiving the timestamp from the host is in response to powering on the storage device or the storage device exiting a low power state. In one example, receiving the timestamp from the host is further in response to a first write command after powering on the storage device or after exiting the low power state. In one example, the method further involves, for each of a plurality of superblocks, storing a timestamp indicating when data was written to a given superblock and the retention time for the data written to the given superblock, in response to powering on the storage device or the storage device exiting a low power state, scanning through data retention times for the plurality of superblocks, and in response to determining the retention time of one or more of the plurality of superblocks exceeds a threshold, moving the data from the one or more of the plurality of superblocks to one or more other superblocks.

In one example, the method involves, in response to entering a low power state or powering down the storage device, storing the timestamp and retention time for each of the plurality of superblocks in non-volatile memory, and in response to exiting the lower power state or powering on the storage device, loading the timestamp and retention time for each of the plurality of superblocks from the non-volatile memory. In one example, storing the timestamp and retention time for each of the plurality of superblocks involves storing the timestamp and retention time for each of the plurality of superblocks in one or more single level cell (SLC) superblocks of the storage device. In one example, moving the data involves placing the one or more blocks in a queue to indicate retention time for data stored in the one or more blocks has exceeded the threshold, and interleaving accesses from the host with writes from the queue. In one example, placing the one or more blocks in the queue involves setting a flag to identify the one or more blocks and to indicate retention time for data stored in the one or more blocks has exceeded the threshold. In one example, the method involves adjusting a ratio for interleaving the accesses from the host with the writes from the queue, wherein the ratio for interleaving is based on one or more of: retention times of blocks in the queue, a number of commands from the host, a number of blocks to be refreshed, and available space for performing refresh. In one example, receiving the timestamp involves receiving the timestamp via a vendor unique command from the host.

In one example, a solid state storage device (SSD) includes solid state storage to store data, and logic to receive a timestamp from a host, store the timestamp in the solid state storage, determine a retention time for data stored in one or more blocks of the solid state storage based on the timestamp relative to a second timestamp indicating when the data was written to the one or more blocks, and in response to a determination that the retention time exceeds a threshold, move the data to one or more other blocks of the storage device. In one example, the receipt of the timestamp from the host is in response to powering on the SSD or the SSD exiting a low power state. In one example, receipt of the timestamp from the host is further in response to a first write command after powering on the SSD or after exiting the SSD. In one example, the logic is to further, for each of a plurality of superblocks, store a timestamp indicating when data was written to a given superblock and the retention time for the data written to the given superblock.

In one example, the logic is to further, in response to powering on the storage device or the storage device exiting a low power state, scan through data retention times for the plurality of superblocks, and in response to determining the retention time of one or more of the plurality of superblocks exceeds a threshold, move the data from the one or more of the plurality of superblocks to one or more other superblocks. In one example, the SSD further includes a volatile memory, wherein in response to entering a low power state or powering down the SSD, the logic is to store the timestamp and retention time for each of the plurality of superblocks in the nonvolatile storage, and wherein in response to exiting the lower power state or powering on the SSD, the logic is to load the timestamp and retention time for each of the plurality of superblocks from the nonvolatile storage to the volatile memory. In one example, in response to entering the low power state or powering down the SSD, the logic is to store the timestamp and retention time for each of the plurality of superblocks in one or more single level cell (SLC) superblocks of the storage device. In one example, the logic to move that data is to place the one or more blocks in a queue to indicate retention time for data stored in the one or more blocks has exceeded the threshold, and interleave accesses from the host with writes from the queue. In one example, the logic to place the one or more blocks in the queue is to: set a flag to identify the one or more blocks and to indicate retention time for data stored in the one or more blocks has exceeded the threshold. In one example, the logic is to: adjust a ratio for interleaving the accesses from the host with the writes from the queue, wherein the ratio for interleaving is based on one or more of: retention times of blocks in the queue, a number of commands from the host, a number of blocks to be refreshed, and available space for performing refresh. In one example, the logic is to receive the timestamp via a vendor unique command from the host. In one example, the logic comprises firmware for the SSD.

In one example, a system includes a processor and a nonvolatile storage device coupled with the processor, the nonvolatile storage device including features described herein. In one example, a solid state storage device (SSD) includes nonvolatile storage to store data, and means to: receive a timestamp from a host, store the timestamp in the nonvolatile storage, determine a retention time for data stored in one or more blocks of the nonvolatile storage based on the timestamp relative to a second timestamp indicating when the data was written to the one or more blocks, and in response to a determination that the retention time exceeds a threshold, move the data to one or more other blocks of the nonvolatile storage.

In one example, the receipt of the timestamp from the host is in response to powering on the SSD or the SSD exiting a low power state. In one example, the receipt of the timestamp from the host is further in response to a first input/output (I/O) command after powering on the SSD or after exiting the low power state. In one example, the SSD includes means to: for each of a plurality of superblocks, store a timestamp indicating when data was written to a given superblock and the retention time for the data written to the given superblock. In one example, the SSD includes means to in response to powering on the SSD or the SSD device exiting a low power state, scan through data retention times for the plurality of superblocks, and in response to determining the retention time of one or more of the plurality of superblocks exceeds a threshold, move the data from the one or more of the plurality of superblocks to one or more other superblocks. In one example, the SSD further includes a volatile memory, and means to: in response to entering a low power state or powering down the SSD, store the timestamp and retention time for each of the plurality of superblocks in the nonvolatile storage, and in response to exiting the lower power state or powering on the storage device, load the timestamp and retention time for each of the plurality of superblocks from the nonvolatile storage to the volatile memory. In one example, the SSD further includes means to in response to entering a low power state or powering down the SSD, store the timestamp and retention time for each of the plurality of superblocks in one or more single level cell (SLC) superblocks of the SSD. In one example, the means to move that data is to: place the one or more blocks in a queue to indicate retention time for data stored in the one or more blocks has exceeded the threshold, and interleave accesses from the host with writes from the queue. In one example, the means to place the one or more blocks in the queue is to: set a flag to identify the one or more blocks and to indicate retention time for data stored in the one or more blocks has exceeded the threshold. In one example, the SSD includes means to adjust a ratio for interleaving the accesses from the host with the writes from the queue, wherein the ratio for interleaving is based on one or more of: retention times of blocks in the queue, a number of commands from the host, a number of blocks to be refreshed, and available space for performing refresh. In one example, the SSD includes means to receive the timestamp via a vendor unique command from the host. In one example, an article of manufacture including a computer readable storage medium having content stored thereon which when accessed causes the performance of operations to execute a method in for performing background refresh as described herein.

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
receiving a first input/output (I/O) command from a host after power on of a storage device or exit from a low power state of the storage device;
receiving a second command in response to the first I/O command and in response to the power on of the storage device or the exit from the low power state of the storage device, the second command to include a current timestamp from the host;
determining a retention time for data stored in one or more blocks of the storage device based on a difference between the current timestamp from the host and a write timestamp indicating when the data was written to the one or more blocks;
storing the current timestamp, the write timestamp, and the retention time in a volatile memory of the storage device when the storage device is operating;
storing the write timestamp and the retention time in single level cell (SLC) blocks of the storage device when the storage device is powered off or in the low power state; and
in response to determining the retention time exceeds a threshold, moving the data to one or more other blocks of the storage device.

2. The method of claim 1, further comprising:
for each of a plurality of superblocks, storing the write timestamp indicating when data was written to a given superblock and the retention time for the data written to the given superblock.

3. The method of claim 2, further comprising:
in response to powering on the storage device or the storage device exiting the low power state, scanning through data retention times for the plurality of superblocks; and
in response to determining a retention time of one or more of the plurality of superblocks exceeds a threshold, moving the data from the one or more of the plurality of superblocks to one or more other superblocks.

4. The method of claim 2, further comprising:
in response to entering the low power state or powering down the storage device, storing the write timestamp and the retention time for each of the plurality of superblocks in nonvolatile storage of the storage device; and
in response to exiting the low power state or powering on the storage device, loading the write timestamp and the retention time for each of the plurality of superblocks from the nonvolatile storage to volatile memory of the storage device.

5. The method of claim 4, wherein storing the write timestamp and the retention time for each of the plurality of superblocks in the nonvolatile storage comprises:
storing the write timestamp and the retention time for each of the plurality of superblocks in one or more single level cell (SLC) superblocks of the storage device.

6. The method of claim 1, wherein moving the data comprises:
placing the one or more blocks in a queue to indicate the retention time for the data stored in the one or more blocks exceeds the threshold; and
interleaving accesses from the host with writes from the queue.

7. The method of claim 6, wherein placing the one or more blocks in the queue comprises setting a flag to identify the one or more blocks and to indicate the retention time for data stored in the one or more blocks has exceeded the threshold.

8. The method of claim 7, further comprising:
adjusting a ratio for interleaving the accesses from the host with the writes from the queue;
wherein the ratio for interleaving is based on one or more of: retention times of blocks in the queue, a number of commands from the host, a number of blocks to be refreshed, and available space for performing refresh.

9. The method of claim 1, wherein receiving the current timestamp comprises:
receiving the current timestamp via a vendor unique command from the host.

10. An article of manufacture comprising a non-transitory computer readable storage medium having content stored thereon which when accessed causes the performance of operations to execute a method comprising:
receiving a first input/output (I/O) command from a host after power on of a storage device or exit from a low power state of the storage device;
receiving a second command in response to the first I/O command and in response to the power on of the storage device or the exit from low power state of the storage device, the second command to include a current timestamp from the host;
determining a retention time for data stored in one or more blocks of the storage device based on a difference between the current timestamp from the host and a write timestamp indicating when the data was written to the one or more blocks;
storing the current timestamp, the write timestamp, and the retention time in a volatile memory of the storage device when the storage device is operating;
storing the write timestamp and the retention time in single level cell (SLC) blocks of the storage device when the storage device is powered off or in the low power state; and
in response to determining the retention time exceeds a threshold, moving the data to one or more other blocks of the storage device.

11. A solid state storage device (SSD) comprising:
nonvolatile storage to store data; and
logic to:
receive a first input/output (I/O) command from a host after power on of the SSD or exit from a low power state of the SSD;
receiving a second command in response to the first I/O command and in response to the power on of the SSD or the exit from the low power state of the SSD, the second command to include a current timestamp from the host;
determine a retention time for data stored in one or more blocks of the nonvolatile storage based on a difference between the current timestamp from the host and a write timestamp indicating when the data was written to the one or more blocks;
store the current timestamp, the write timestamp, and the retention time in a volatile memory of the SSD when the SSD is operating;
store the write timestamp and the retention time in single level cell (SLC) blocks of the SSD when the SSD is powered off or in the low power state; and
in response to a determination that the retention time exceeds a threshold, move the data to one or more other blocks of the nonvolatile storage.

12. The SSD of claim 11, wherein the receipt of the second command from the host is further in response to the first I/O command after powering on the SSD or after exiting the low power state by the SSD.

13. The SSD of claim 11, wherein the logic is to further:
for each of a plurality of superblocks, store the write timestamp indicating when data was written to a given superblock and the retention time for the data written to the given superblock.

14. The SSD of claim 13, wherein the logic is to further:
in response to powering on the SSD or the SSD exiting the low power state, scan through data retention times for the plurality of superblocks; and
in response to determining a retention time of one or more of the plurality of superblocks exceeds a threshold, move the data from the one or more of the plurality of superblocks to one or more other superblocks.

15. The SSD of claim 13, further comprising:
a volatile memory;
wherein in response to entering the low power state or powering down the SSD, the logic is to store the write timestamp and the retention time for each of the plurality of superblocks in the nonvolatile storage; and
wherein in response to exiting the low power state or powering on the SSD, the logic is to load the write timestamp and the retention time for each of the plurality of superblocks from the nonvolatile storage to the volatile memory.

16. The SSD of claim 11, wherein the logic comprises firmware for the SSD.

* * * * *